United States Patent [19]

Kikuga et al.

[11] 4,122,211

[45] Oct. 24, 1978

[54] PROCESS FOR COATING ELECTRIC OR ELECTRONIC ELEMENTS

[75] Inventors: Toyoji Kikuga; Masayuki Nakamura; Tateo Goto; Tosaku Amakawa, all of Fujieda, Japan

[73] Assignee: Sumitomo Durez Company, Ltd., Tokyo, Japan

[21] Appl. No.: 751,627

[22] Filed: Dec. 17, 1976

[30] Foreign Application Priority Data

Dec. 25, 1975 [JP] Japan ............................. 50/153958

[51] Int. Cl.$^2$ ............................................. B05D 1/04
[52] U.S. Cl. ................................. 427/27; 427/58; 427/81; 427/103; 427/202; 427/407 R; 174/52 PE; 338/257; 338/262; 361/301; 361/314; 361/315
[58] Field of Search .................. 427/58, 25, 27, 81; 174/52 PE; 361/314, 315, 301; 338/257, 262

[56] References Cited

U.S. PATENT DOCUMENTS

| | | | |
|---|---|---|---|
| 2,938,153 | 5/1960 | Wertherwood | 361/314 |
| 3,513,012 | 5/1970 | Point | 427/27 |
| 3,573,575 | 4/1971 | Brady et al. | 427/81 |
| 3,652,333 | 3/1972 | Warren | 260/30.4 N |
| 3,693,252 | 9/1972 | Robertson et al. | 29/627 |
| 3,998,716 | 12/1976 | Masar et al. | 427/27 |

FOREIGN PATENT DOCUMENTS

| | | | |
|---|---|---|---|
| 1,073,107 | 1/1960 | Fed. Rep. of Germany | 427/81 |
| 933,250 | 8/1963 | United Kingdom | 427/25 |

*Primary Examiner*—John T. Goolkasian
*Attorney, Agent, or Firm*—Peter F. Casella; James F. Mudd; William G. Gosz

[57] ABSTRACT

A process for coating electronic elements comprises the steps of (1) forcibly impregnating an element with a liquid thermosetting resin undercoat, (2) depositing a powdered coating material on the element as a topcoat by electrostatic fluidized bed dip coating the element before the undercoat is dry, and (3) curing the resin by heating.

9 Claims, No Drawings

PROCESS FOR COATING ELECTRIC OR ELECTRONIC ELEMENTS

BACKGROUND OF THE INVENTION

The present invention relates to a process for coating electronic elements such as capacitors, resistors, or assembled modules of circuits with powdered coating materials for the purpose of improving their insulation characteristics and protecting the elements from moisture.

More specifically the present invention provides a process comprising the forced impregnation of electronic elements with a liquid thermosetting resin undercoat, applying a powdered coating material thereon as a top-coat by electrostatic fluidized bed dip coating before the undercoat is dry, and curing the resin by heating. The process of this invention provides for many improvements over the prior art processes, such as, for example, reduced working time since it does not require the drying and curing steps of the prior art, improved adhesion of the powdered coating material to the elements, and coatings of uniform thickness and fewer pinholes for better protection against moisture.

The use of powdered coating materials for electronic elements has become popular in recent years due to their superior performance in comparison with conventional solvent-type coating materials, and also due to shortened coating times, an improved working environment, and reduced loss of coating materials. However, conventional coating processes using powdered coating materials are generally associated with certain disadvantages such as (a) insufficient deposition of powdered coating material (leading to uneven thickness), (b) tendency to form pinholes, (c) inferior protection against moisture, and (d) poor adhesion between the coating and the element.

In order to overcome these disadvantages, various coating processes have been proposed. However, such processes still suffer from certain other undesirable features. Some of these processes include the following:

(1) Applying a plasticizer, a thermoplastic resin, or a solvent, etc., to the element as an undercoat, followed by the application of a powdered coating material. This method is undesirable since the coating has a tendency to form pinholes, begin oozing, and show insufficient adhesion to the element.

(2) Applying a thermosetting resin to the element as an undercoat, followed by drying and curing, and by the application of a powdered coating material. This method is undesirable due to poor pickup of powdered coating material, difficulty in obtaining a uniform coating thickness, prolonged working periods, and the possibility of eventual pinhole formation even when a very small amount of coating is applied.

(3) Applying a thermosetting resin to the element as an undercoat, by brush coating or spraying, followed by application of a powdered coating material while the undercoating is still wet. Although this method provides for satisfactory adhesion of the coating to the element, and also for satisfactory pickup of powdered coating material if electrostatic coating methods are employed, the coating has a tendency for pinhole formation resulting in inferior moisture protection.

Some coating processes require a preheating step in which a powdered coating material is applied to a preheated element by such methods as fluidized bed dipping, sprinkling, rolling, and spraying. However, the thermosetting resin undercoat tends to cure during preheating leading to an unsatisfactory adhesion of the powdered coating material to the element and to difficulty in obtaining a uniform thickness. These processes are also disadvantageous in that the powdered coating material is applied to a part of the element where such coating is unnecessary, such as the lead wires of an element.

In order to avoid preheating the element, the coating material can be applied to the element by, for example, dip coating, electrostatic spray coating, and electrostatic fluidized bed dip coating. The dip coating and electrostatic spray coating methods prove to be unsatisfactory, however, for the following reasons. In the dip coating method, only a very limited amount of powdered coating material is picked up by the element even when a liquid thermosetting resin is employed as an undercoat. The electrostatic spray coating method requires protection against the generation of powder dust and is not practical since the elements to be coated are small in size.

SUMMARY OF THE INVENTION

In order to overcome the disadvantages of the prior art processes, the inventors have now found that an improved process for coating electronic elements comprises the steps of forced impregnation of an electronic element with a liquid thermosetting resin undercoat, applying a powdered coating material to the element as a topcoat by electrostatic fluidized bed dip coating the element before the undercoat is dry, and curing the resin by heating. This process provides a coating having excellent adhesive properties, uniform thickness, virtually no pinholes, and excellent protection against moisture.

DESCRIPTION OF THE INVENTION

The present invention provides for forced impregnation of an electronic element with a liquid thermosetting resin undercoat. By "forced impregnation" is meant impregnation of an element under either increased pressure and/or reduced pressure conditions. It has been found that forced impregnation provides for the prevention of pinhole formation by eliminating the air pockets contained in elements having pores or gaps. The formation of pinholes would not be prevented by simple brush or spray coating. This is a significant improvement over the prior art processes since pinhole formation is closely related to mositure protection. Consequently, the reliability of the product is substantially increased by the elimination of pinholes.

The liquid thermosetting resins employed in this invention as undercoats are conventional. Examples are epoxy resins which contain hardeners, unsaturated polyester resins, resole type phenolic resins, diallyl phthalate resins, urethane resins, butadiene polymers, silicone resins, etc., as well as mixtures thereof. Epoxy resins are preferred. Furthermore, the liquid thermosetting resins mentioned above should preferably be free from solvents. Other materials used as undercoats, such as plasticizers, thermoplastic resins, or solvents, were found incapable of providing a smooth coating due to an oozing phenomenon upon heating the element after applying a powdered coating material, and were found to have inferior adhesion to the element.

Examples of the powdered coating materials which may be employed as topcoats are resins such as epoxy resins, polyester resins, acrylic resins, polyurethane resins, polyamide resins, vinyl chloride resins, etc., as well as mixtures thereof. Epoxy resins are preferred.

The present invention employs the electrostatic fluidized bed dip coating method for coating electronic elements. According to this method, an article to be coated is electrically grounded and brought close to a fluidized powder bed, which is electrostatically charged to a potential of 20-100 KU, to deposit the powder onto the article. This method overcomes many of the disadvantages of the prior art process described above.

The process of the present invention is particularly adaptable for coating film capacitors, such as polypropylene film capacitors, polyester film capacitors, polystyrene film capacitors, polycarbonate film capacitors, etc., carbon film resistors, varistors, and assembled modules of circuits comprising such elements, as well as tantalum electrolytic capacitors, or for elements which have a tendency for forming pores or gaps.

As explained above, the advantages of the present invention are achieved by the forced impregnation of an electronic element with a liquid thermosetting resin, in combination with the application of a powdered coating material to the element using electrostatic fluidized bed dip coating methods. In conventional processes, elements having pores or gaps have to be coated several times, for example 3 to 10 times, with the necessity of using very thin coatings due to the need for overcoming poor pickup and pinhole formation. In contrast, the process of the present invention is capable of providing virtually pinhole-free, uniform coating within a limited time, and is therefore valuable for improving industrial productivity.

The following examples are presented to illustrate and explain more particularly the present invention, but it should be understood that the present invention is not limited thereby. The "parts" and "percentages" indicated in the specification and claims are by weight unless otherwise specified.

COMPARATIVE EXAMPLE 1

Tab-type polyester film capacitors were coated with a thermoplastic resin, a liquid hardener-free epoxy resin (Epicote 828; Shell Chemical) as an undercoat, and then the wet elements were coated with an epoxy resin powdered coating material (Sumiliteresin PR-52121; Sumitomo Durez) for 10 seconds by electrostatic fluidized bed dip coating. After elimination of the powdered coating material deposited on the unnecessary parts by means of a vacuum cleaner, the coatings thus obtained were cured at 130° C. for 1 hour. However the completed coating showed ooze of liquid epoxy resin and pinhole formation in 48 elements out of the 50 elements treated in total, and moisture protection was insufficient for practical purpose.

COMPARATIVE EXAMPLE 2

Tab-type polyester film capacitors were first coated with a mixture of 100 parts of a liquid epoxy resin (Epicote 828; Shell Chemical) and 90 parts of a liquid acid anhydride hardener (Nadic Methyl Anhydride; Hitachi Chemical) with a brush, and the undercoat was cured for 1 hour at 130° C. The undercoated capacitors were preheated to 130° C. and then coated with an epoxy resin powdered coating material (Sumiliteresin PR-52121; Sumitomo Durez) by fluidized bed dip coating. The steps of above-mentioned preheating and fluidized bed dipping were repeated 5 times, and the coating obtained was cured for 1 hour at 130° C. However, due to limited thermal capacity of the above-mentioned capacitors, deposition of the powdered coating material was poor, particularly at the tip thereof, and formation of pinholes was observed in 40 elements out of the 50 elements treated due to a thin deposition even when a coating was formed. The use of electrostatic fluidized bed dip coating followed by curing did not improve deposition on the electrodeless tip portion, and formation of pinholes was observed in 43 elements out of the 50 elements treated in this case.

COMPARATIVE EXAMPLE 3

Tab-type polyester film capacitors were first brush-coated with a mixture of 100 parts of a liquid epoxy resin (Epicote 828; Shell Chemical) and 90 parts of a liquid acid anhydride hardener (Nadic Methyl Anhydride; Hitachi Chemical). The wet elements were subjected to fluidized bed dip coating with an epoxy powdered coating material (Sumiliteresin PR-52102; Sumitomo Durez) at ambient temperature, and the coating was cured for 2 hours at 120° C. However, deposition of powdered coating material was poor at the tip of the capacitors, and pinholes were observed in 43 elements out of the 50 elements treated. Although the use of electrostatic fluidized bed dip coating provided an almost satisfactory deposition of powdered coating material onto the tip, formation of pinholes and cracks was observed in 40 elements out of the 50 elements treated.

EXAMPLE 1

Tab-type polyester film capacitors were first dipped in a mixture of 100 parts of a liquid epoxy resin (Epicote 828; Shell Chemical) and 90 parts of a liquid acid anhydride hardener (Nadic Methyl Anhydride; Hitachi Chemical) to cover a 1 mm length of the lead wire dipped in said mixture, and said mixture was made to permeate into the capacitors under reduced pressure. The wet elements were then subjected to electrostatic fluidized bed dip coating with an epoxy resin powdered coating material (Sumiliteresin PR-52121; Sumitomo Durez) for 5 seconds. After elimination of the powdered coating material deposited on unnecessary parts, the coating obtained was cured for 1 hour at 130° C. The capacitors were in this manner given a uniform coating 0.3 mm thick, which covered only 1 mm length of the lead wires, and showed pinholes or cracks in only 2 elements out of the 50 elements treated, and exhibited excellent moisture protection.

EXAMPLE 2

The process of Example 1 was repeated on non-inductive polyester film capacitors to form a coating 0.3 mm thick which had a good appearance, and showed pinhole formation in only 1 element out of the 50 elements treated, and had excellent moisture protection.

EXAMPLE 3

Polypropylene film capacitors were dipped in a phenolic resin varnish (Sumilac PC-1; Sumitomo Durez) to cover a 1 mm length of the lead wires which were dipped, and said varnish was then made to permeate into said capacitors under reduced pressure. The wet elements were then subjected to electrostatic fluidized bed dip coating with an epoxy powdered coating material (Sumiliteresin PR-52102; Sumitomo Durez) for 10 seconds. After eliminating the powdered coating material deposited on unnecessary parts with a vacuum cleaner, the coating obtained was cured for 4 hours at 90° C. In this manner, a uniform coating 0.6 mm thick, which was free from pinholes or cracks and covered 1 mm length of the lead wires, was obtained.

EXAMPLE 4

Polystyrene film capacitors were dipped in a mixture of 100 parts of a liquid epoxy resin (Epicote 815; Shell Chemical) and 3 parts of a tertiary amine hardener (DMP-30; Rhom & Haas) covering only a 1 mm length of the lead wires, and the resin was then made to permeate into said capacitors under reduced and then increased pressure. The wet elements were treated in the same manner as in Example 3 to obtain coated products which were provided with a uniform coating 0.3 mm thick completely free from pinholes.

EXAMPLE 5

Carbon film resistors were dipped in a mixture of 100 parts of a liquid epoxy resin (Epicote 815; Shell Chemical), 80 parts of an acid anhydride hardener (hexahydrophthalic anhydride; Shin Nihon Rika), and 20 parts of phthalic anhydride (Nippon Catalyst Chemical Industries) so as that only 1 mm length of the lead wires were covered by said mixture. The mixture was then made to permeate into said resistors under reduced pressure. The wet elements were then subjected to electrostatic fluidized bed dip coating with an epoxy powdered coating material (Sumiliteresin PR-52114; Sumitomo Durez) for 3 seconds. After elimination of the powdered coating material deposited on unnecessary parts by a vacuum cleaner, the coating obtained was cured for 5 minutes at 180° C. In this manner, a uniform coating 0.3 mm thick, which covered only 1 mm length of the lead wires, and which showed pinhole formation in only 1 element out of the 50 elements treated, was obtained.

EXAMPLE 6

Tab-type polyester film capacitors were dipped in a mixture of 100 parts of an unsaturated polyester resin (Hetron 92; Hooker Chemicals & Plastics) and 1.5 parts of a catalyst (benzoyl peroxide) to cover only 1 mm length of the lead wires which were dipped in said mixture, and the mixture was made to permeate into the capacitors under reduced and then increased pressure. The wet elements were then subjected to coating followed by curing of an epoxy resin powdered coating material in the same manner as in Example 1. In this manner, coated products provided with a uniform coating 0.3 mm thick, which was completely free from pinholes or cracks and having an excellent appearance, were obtained.

REFERENCE EXAMPLE 1

Tab-type polyester film capacitors were impregnated with a mixture of 100 parts of a liquid epoxy resin (Epicote 828; Shell Chemical) and 90 parts of a liquid acid anhydride hardener (Nadic Methyl Anhydride; Hitachi Chemical) under reduced pressure, and the undercoat thus obtained was cured for 1 hour at 130° C. The capacitors were then subjected to electrostatic fluidized bed dip coating with an epoxy powdered coating material (Sumiliteresin PR-52121; Sumitomo Durez) for 10 seconds. After elimination of the powdered coating material deposited on the unnecessary parts with a vacuum cleaner, the coating was cured for 1 hour at 130° C. In this manner, a uniform thickness could not be obtained as the powdered coating material was not deposited uniformly on the capacitor elements.

In an alternative test, the undercoated and heat-treated elements as above-mentioned were subjected to preheating at 130° C. and fluidized bed dipping, both repeated 5 times, and the coating thus obtained was cured for 1 hour at 130° C. However, deposition of powdered coating material on the tips of capacitors was insufficient to obtain a satisfactory coating thickness due to the limited thermal capacity of the capacitors.

REFERENCE EXAMPLE 2

Tab-type polyester film capacitors were impregnated with a mixture of 100 parts of a liquid epoxy resin (Epicote 828; Shell Chemical) and 90 parts of a liquid acid anhydride hardener (Nadic Methyl Anhydride; Hitachi Chemical) under reduced pressure. The wet elements were subjected to fluidized bed dip coating with an epoxy powdered coating material (Sumiliteresin PR-52102; Sumitomo Durez) at ambient temperature, and the coating was cured for 2 hours at 120° C. The coating thus obtained showed undesirable cracks in 40 elements out of the 50 elements treated due to poor deposition of powdered coating material on the tip of the capacitors.

REFERENCE EXAMPLE 3

Moisture prevention of the coated products prepared in the foregoing Examples and Comparative Examples were tested for electric insulation resistance before and after 48 hours of treatment under accelerated test conditions at 85° C. and 90-95% R.H., and other conditions defined in JIS-C-5102. Representative test results summarized in the following table indicate that the coatings obtained in the foregoing Examples of the present invention are far superior in comparison with those prepared in the Comparative Examples.

|  | Method of application of powdered coating material | Insulation resistance (ohms)* | |
|---|---|---|---|
|  |  | Before accelerated test | After accelerated test |
| Example 1 | Electrostatic fluidized bed dipping | $10^{11}$ | $10^{11}$ |
| Example 2 | " | " | " |
| Example 3 | " | " | " |
| Com. Ex. 1 | " | " | $3.0 \times 10^5$ |
| Com. Ex. 2 | Fluidized bed dipping | " | $9.6 \times 10^5$ |
|  | Electrostatic fluidized dipping | " | $4.0 \times 10^5$ |

*Note: These Figures represent the average of 10 measurements in each Example.

We claim:
1. An improved coating process for electronic elements which comprises the steps of:
(1) forcibly impregnating the element with a liquid thermosetting resin,
(2) applying a powdered resin to the element before the liquid thermosetting resin is dry by electrostatic fluidized bed dip coating, and

(3) heating the element to cure the liquid thermosetting resin.

2. The process of claim 1 wherein the liquid thermosetting resin is selected from the group consisting of epoxy resins containing hardeners, unsaturated polyester resins, resole-type phenolic resin, diallyl phthalate resins, urethane resins, butadiene polymers, silicone resins, and mixtures thereof.

3. The process of claim 2 wherein the liquid thermosetting resin is an epoxy resin containing a liquid acid anhydride hardener.

4. The process of claim 1 wherein the powdered resin is selected from the group consisting of epoxy resins, polyester resins, acrylic resins, polyurethane resins, polyamide resins, vinyl chloride resins, and mixtures thereof.

5. The process of claim 4 wherein the powdered resin is an epoxy resin.

6. An electronic element coated by the process of claim 1.

7. A film capacitor coated by the process of claim 1.

8. A resistor coated by the process of claim 1.

9. An assembled circuit module coated by the process of claim 1.

* * * * *